Figure 1:
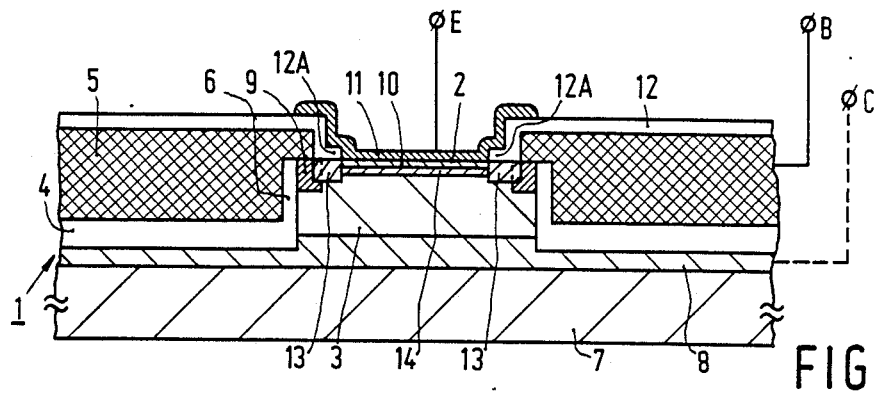

United States Patent [19]

Van der Velden et al.

[11] Patent Number: 4,969,026
[45] Date of Patent: Nov. 6, 1990

[54] MESA BIPOLAR TRANSISTOR WITH EDGE CONTACTS

[75] Inventors: Johannes W. A. Van der Velden; Henricus G. R. Maas; Marguerite M. C. Van Iersel-Schiffmacher, all of Eindhoven, Netherlands

[73] Assignee: U.S. Philips Corporation, New York, N.Y.

[21] Appl. No.: 506,484

[22] Filed: Apr. 6, 1990

Related U.S. Application Data

[63] Continuation of Ser. No. 301,578, Jan. 24, 1989.

[30] Foreign Application Priority Data

Jan. 25, 1988 [NL] Netherlands ............... 8800157

[51] Int. Cl.$^5$ .................. H01L 27/12; H01L 27/04; H01L 29/06; H01L 29/34
[52] U.S. Cl. ........................... 357/34; 357/49; 357/50; 357/52; 357/56
[58] Field of Search ............ 357/49, 50, 52, 56, 357/68, 34

[56] References Cited

U.S. PATENT DOCUMENTS

| | | | |
|---|---|---|---|
| Re. 31,580 | 5/1989 | Kodi | 357/23 |
| 4,680,085 | 7/1987 | Vijan et al. | 156/643 |
| 4,746,623 | 5/1988 | Lane | 437/28 |

OTHER PUBLICATIONS

Washio et al., "E 48 ps ECL in a Self-Aligned Bipolar Technology," ISSCC '87, pp. 58–59.

Primary Examiner—Andrew J. James
Assistant Examiner—Stephen D. Meier
Attorney, Agent, or Firm—Paul R. Miller

[57] ABSTRACT

A semiconductor device having a monocrystalline silicon region (3) comprising a first zone (9) and an adjacent second zone (10) and laterally enclosed by a sunken oxide layer (4) and by an overlying highly doped polycrystalline silicon layer (5). The silicon layer (5) is laterally separated by an oxide layer (6) from the silicon region (3) and adjoins the first zone (9) on a narrow edge portion of the upper surface of the region (3), this zone being of the same conductivity type as the silicon layer (5). The second zone (10) is provided with an electrode layer (11). According to the invention, the silicon layer (5) is separated from the electrode layer (11) by an oxide strip (12A) formed in a self-aligned manner and at least one doped connection zone (13) having a width determined by the oxide strip (12A) is situated between the first and the second zones and located below the oxide strip (12A). The invention further relates to a method of manufacturing this device.

3 Claims, 4 Drawing Sheets

MESA BIPOLAR TRANSISTOR WITH EDGE CONTACTS

This is a continuation of application Ser. No. 301,578, filed Jan. 24, 1989.

The invention relates to a semiconductor device having a semiconductor body comprising a surface-adjoining region of monocrystalline silicon, which is laterally surrounded at least in part by a sunken oxide layer, and a highly doped silicon layer disposed thereon, the silicon layer being laterally separated substantially entirely from the region by an oxide layer, the region comprising a doped first zone of the same conductivity type as the silicon layer adjoining at least the edge of the region and an adjacent second zone, the silicon layer adjoining the first zone on an edge portion of the surface of the region, the second zone being provided with an electrode.

The invention further relates to a method of manufacturing the device.

A semiconductor device of the kind described above is known from the publication of Washio et al: "A 48 ps ECL in a Self-Aligned Bipolar Technology", ISSCC '87, pag. 58–59.

This publication discloses a bipolar transistor, which is provided in a mesa-shaped semiconductor region of silicon. The mesa-shaped region is located above a highly doped buried layer and is laterally enclosed by a sunken oxide layer and a polycrystalline silicon layer disposed thereon, which adjoins a highly doped base contact zone on the upper surface of the mesa and is laterally separated from the mesa substantially entirely by an oxide layer.

This known transistor has very small dimensions due to the fact that successful attempts have been made to cause the polycrystalline silicon layer to adjoin in a self-aligned manner only a very narrow edge region of the mesa.

However, a disadvantage of this construction is that the connection between the polycrystalline base connection and the base zone is established solely via the base contact zone diffused from the polycrystalline silicon. Irregularities in this edge region, which are liable to occur due to the fact that the so-called "bird's beak" edge structure of the sunken oxide layer is not always the same, can give rise to either a poor base connection or too short a distance between the polycrystalline base connection and the emitter zone. Due to the fact that the base contact zone and the emitter zone, which are both highly doped, adjoin each other, the emitter-base breakdown voltage can be considerably reduced, while in given circumstances the emitter-base junction can even extend partly in polycrystalline material, which can adversely affect the transistor properties.

It should be noted that in this application the term "polycrystalline silicon layer" is to be understood to mean any non-monocrystalline silicon layer, therefore also, for example, an amorphous silicon layer.

The invention has inter alia for its object to provide an improved semiconductor device and a method of manufacturing same, in which the disadvantages are avoided or are reduced at least to a considerable extent.

According to the invention, a semiconductor device of the kind described in the opening paragraph is characterized in that the silicon layer is separated from the electrode by an oxide strip formed in a self-aligned manner and in that at least one doped connection zone located below the oxide strip is present between the first and the second zone, the connection zone adjoining said first and second zones and having a width determined by the oxide strip.

By the use of a self-aligned connection zone, whose doping can be chosen independently and whose width can be made very small, the aforementioned disadvantages can be avoided without the dimensions of the transistor being markedly increased.

According to a first preferred embodiment, the first zone constitutes the base contact zone of a bipolar transistor, the second zone constituting the emitter zone and the silicon layer constituting the base connection of the bipolar transistor.

Another preferred embodiment is characterized in that the first zone constitutes the emitter zone of a bipolar transistor, the second zone constituting the base contact zone and the silicon layer constituting the emitter connection of the bipolar transistor. As a result, transistors having emitter zones of submicron dimensions can be realized, as will be explained more fully hereinafter.

The invention further relates to a particularly suitable method by which the semiconductor device can be manufactured with the use of a minimum number of masking steps.

According to the invention, this method is characterized in that 1. an insulating intermediate layer containing silicon oxide is provided on the surface of a monocrystalline silicon region and a first silicon nitride layer is provided on the intermediate layer,
2. a first silicon layer is provided on the first silicon nitride layer,
3. a silicon pattern is etched from the first silicon layer,
4. at least the edge of the silicon pattern is provided with an oxide layer by thermal oxidation,
5. the uncovered part of the first silicon nitride layer, and the subjacent intermediate layer are removed,
6. a depression is etched into the exposed part of the silicon region,
7. the uncovered oxide is removed,
8. the uncovered silicon is provided with a further oxide layer by thermal oxidation,
9. the remaining exposed parts of the first silicon nitride layer and the intermediate layer are removed,
10. a second highly doped silicon layer is provided on the assembly, the second silicon layer being removed by planarization and etching down to a level located below that of the oxide present on the first silicon layer,
11. the exposed silicon oxide is selectively removed by etching,
12. the exposed parts of the first silicon nitride layer are removed and at least one connection zone is formed in the subjacent parts of the silicon region by doping,
13. the first silicon layer is selectively removed, the second silicon layer and the connection zone are oxidized and at least one first zone is formed by diffusion from the second silicon layer,
14. the first silicon nitride layer is removed, and
15. an electrode is provided on the surface of a second zone located within the window thus formed and bounded by the further oxide layer.

According to this method, the semiconductor device can essentially be manufactured up to the metallization step by means of only one single masking step.

Preferably, the method is carried out in such a manner that after step (6) and before step (7) the uncovered silicon is provided with an oxide layer, on which a second silicon nitride layer is formed, which is then removed by plasma etching from the faces parallel to the surface, and that after step (8) and before step (9) the remaining exposed parts of the second silicon nitride layer are removed and the silicon surface thus exposed is oxidized.

According to another preferred embodiment, the method is carried out in such a manner that after step (7) and before step (8) a second silicon nitride layer is provided on the assembly, which layer is thinner than the first nitride layer and is removed by plasma etching from the faces parallel to the surface, and that after step (8) and before step (9) the remaining exposed parts of the second silicon nitride layer are removed and the silicon surface thus exposed is oxidized.

Figure 10:
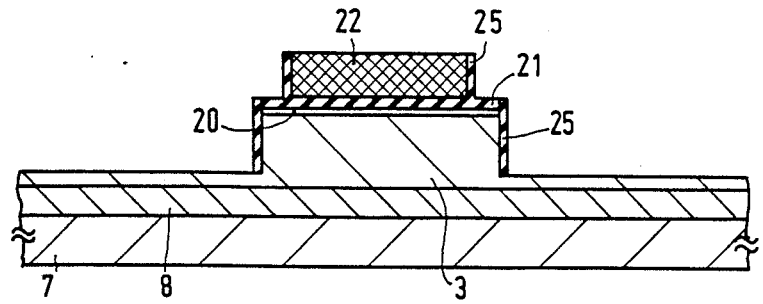
Figure 11:
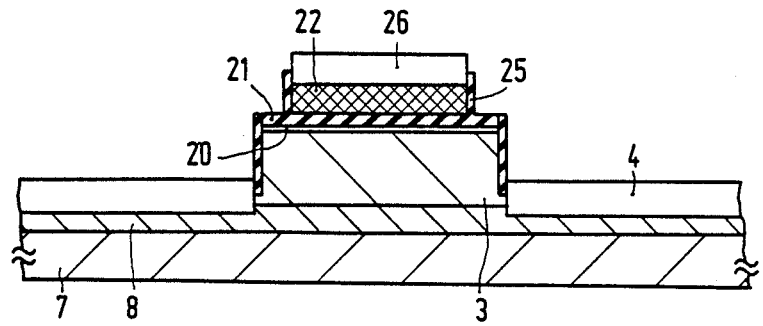
Figure 12:
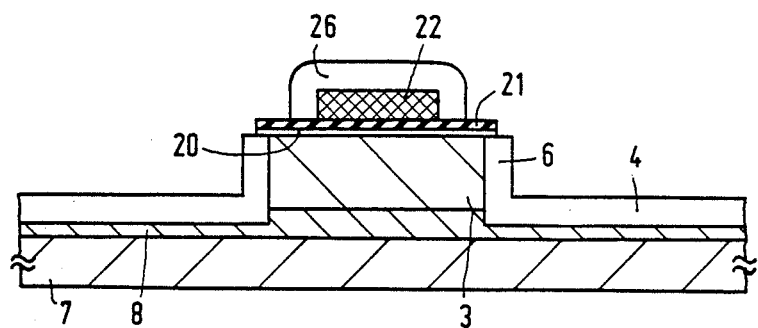
Figure 13:
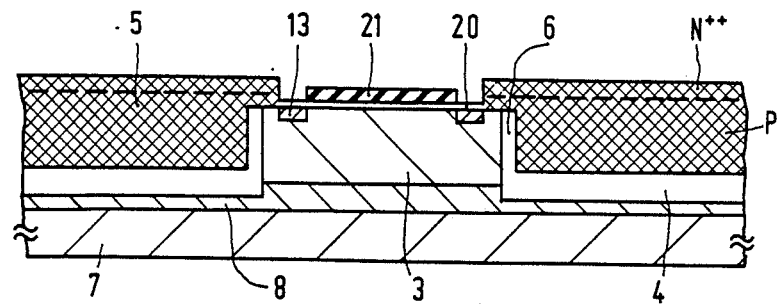
Figure 14:
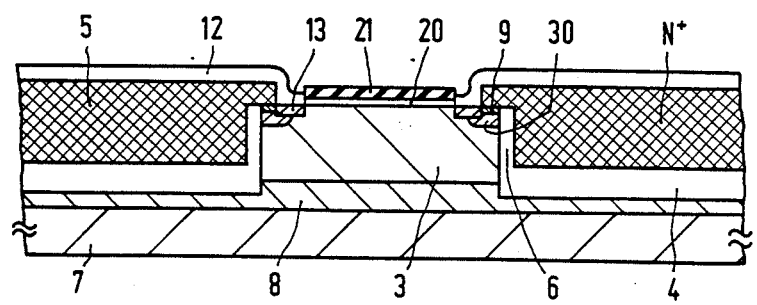
Figure 15:
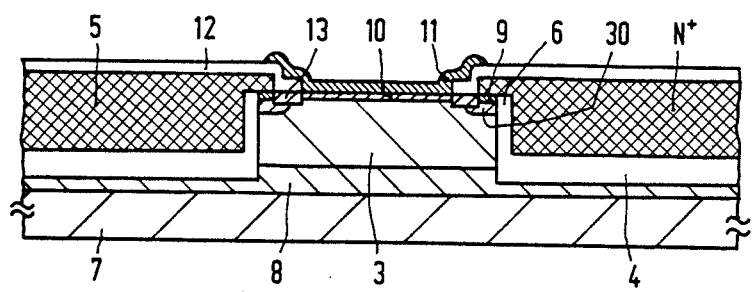

The invention will now be described more fully with reference to a few embodiments and the drawing, in which:

FIG. 1 shows diagrammatically in cross-section a semiconductor device according to the invention, FIGS. 2, 3, 4, 5, 6, 7, 8 and 9 show diagrammatically in cross-section a semiconductor device according to the invention at successive stages of manufacture, FIGS. 10 and 11 show successive stages according to a first variation of the method in accordance with the invention, FIG. 12 shows a stage of a second variation of the method according to the invention, and FIGS. 13, 14 and 15 show successive stages of manufacture of a semiconductor device according to the invention in a further embodiment of the method in accordance with the invention.

The Figures are schematic and not drawn to scale for the sake of clarity. Corresponding parts are generally designated by the same reference numerals. Semiconductor zones of the same conductivity type are cross-hatched in the same direction.

FIG. 1 shows diagrammatically in cross-section a semiconductor device according to the invention. The device comprises a semiconductor body 1 having a monocrystalline semiconductor region 3 of silicon of a first conductivity type adjoining a surface 2 and surrounded laterally at least in part by a sunken silicon oxide layer 4, and a highly doped silicon layer 5 of a second conductivity type disposed thereon and laterally separated substantially entirely by an oxide layer 6 from the region 3. The semiconductor region is constituted in this embodiment by a part of an epitaxial layer grown onto a substrate 7 of the second conductivity type. A highly doped buried layer 8 of the same conductivity type as the region 3 is located between the region 3 and the substrate 7.

The region 3 further comprises a doped first zone 9 of the same conductivity type as the silicon layer 5 adjoining the edge of this region 3 and an adjacent doped second zone 10 of the first conductivity type. In this embodiment, the region 3 is n-type conducting, the silicon layer 5 and the zone 9 are p-type conducting and the zone 10 is n-type conducting.

The silicon layer 5 adjoins the first zone 9 on an edge portion of the surface 2 of the semiconductor region 3, while an electrode layer 11 adjoining the second zone 10 is provided on the surface 2.

According to the invention, the silicon layer 5 is separated from the electrode 11 by an oxide strip 12A formed in a self-aligned manner and at least one doped connection zone 13 located below the oxide strip 12A is present between the first zone 9 and the second zone 10, which zone 13 adjoins the first zone 9 and the second zone 10 and has a width determined by the oxide strip 12A.

The connection zone 13 can be made very narrow because it is obtained in a self-aligned manner. By the use of this connection zone, whose doping can be freely chosen, the problems at the edge of the sunken oxide described above can be avoided.

In the present embodiment, the first zone 9 constitutes the base contact zone of a bipolar transistor. The less highly doped zone 14 of the same conductivity type constitutes the active base zone of the transistor (cf. FIG. 1). The second zone 10 of the first conductivity type constitutes the emitter zone (emitter connection E) and the silicon layer 5 constitutes the base connection. The collector (C) is contacted via the buried layer 8; this collector contact is located outside the plane of the drawing and is indicated only diagrammatically.

The semiconductor device described can be manufactured as follows.

The starting material (cf. FIG. 2) is a p-type conducting substrate 7 of silicon, in which a highly doped n-type layer 8 is formed by means of ion implantation and on which is then grown an epitaxial layer 3 having a thickness of, for example, about 1 $\mu$m and a doping of, for example, about $10^{16}$ at/cm$^3$.

According to the invention, a thin intermediate silicon oxide containing layer 20 of silicon oxide or silicon oxynitride having a thickness of, for example, 50 nm is then formed on the surface of the monocrystalline epitaxial layer 3, while on this intermediate layer is formed a first silicon nitride layer 21 (thickness about 120 nm). On the latter layer is deposited an undoped polycrystalline silicon layer 22 having a thickness of, for example, about 1.2 $\mu$m.

Figure 2:
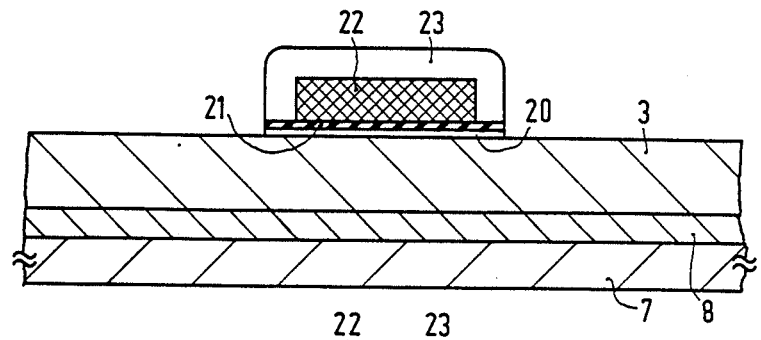
Figure 3:
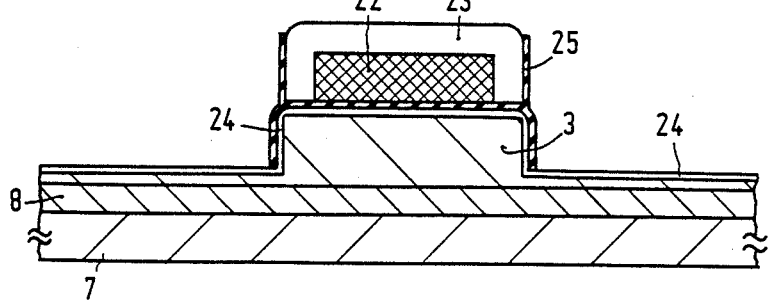

Subsequently, a pattern, for example in the form of an island, is etched from this silicon layer 22 by the use of a photolithographic etching process, whereupon this pattern is provided with an approximately 1 $\mu$m thick oxide layer by thermal oxidation at a temperature of 1000° C. for 3.5 hours. The uncovered part of the layers 21 and 20 is then removed by selective etching successively in hot phosphoric acid and in a buffered solution of HF in water. Thus, the structure shown in FIG. 2 is obtained.

A depression is now etched into the exposed uncovered part of the silicon so that a mesa-shaped region is obtained. In this embodiment (cf. FIG. 3), the mesa-shaped region only comprises parts of the epitaxial layer 3; however, the depression may also be etched through the layer 3.

In the embodiment of the method described here, the uncovered silicon is then provided by thermal oxidation with an oxide layer 24, on which a second silicon nitride layer 25 is formed having a thickness of about 50 nm. This layer 25 is then selectively removed by plasma etching from the horizontal faces parallel to the surface 2, while it is maintained on the vertical faces (cf. FIG. 3).

Figure 4:
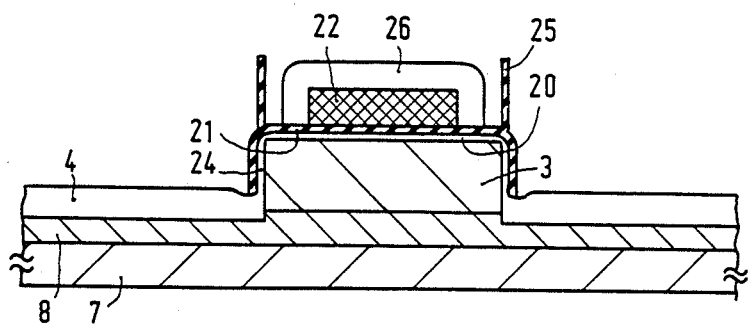

The uncovered oxide (in this embodiment the oxide layers 23 and 24) is now removed by etching, after which the uncovered silicon is provided by thermal oxidation with fresh oxide layers 4 and 26 (cf. FIG. 4). The oxide layer 4 has, for example, a thickness of 1 $\mu$m and the oxide layer 26 on the polycrystalline silicon 22 has a thickness of about 1.2 μm.

Figure 5:
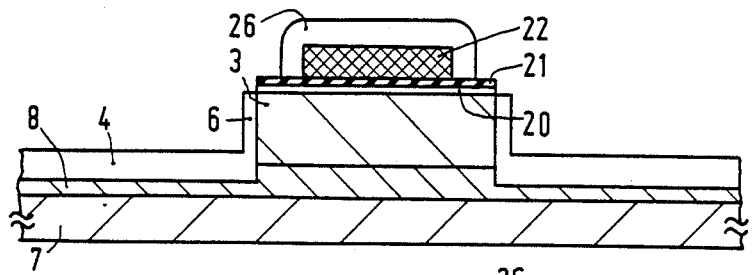

Subsequently, the remaining exposed parts of the second silicon nitride layer 25 are etched away, a part of the silicon nitride 21 being maintained, after which the oxide layer 6 having a thickness of, for example, 0.3 μm is formed by thermal oxidation (cf. FIG. 5.)

Figure 6:
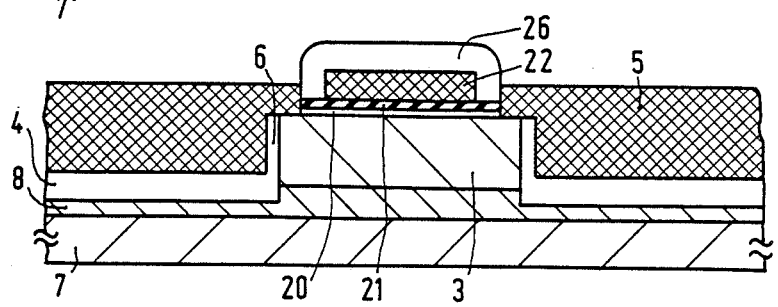

The remaining exposed parts of the first silicon nitride layer 21 and of the intermediate layer 20 are then removed by the etching. A second silicon layer 5 is then provided on the assembly, which second silicon layer is highly p-doped during or after the provision. This silicon layer 5 is then removed by planarization and etching by means of known techniques down to a level located below that of the oxide 26 present on the first silicon layer 22. Thus, the situation shown in FIG. 6 is obtained.

Figure 7:
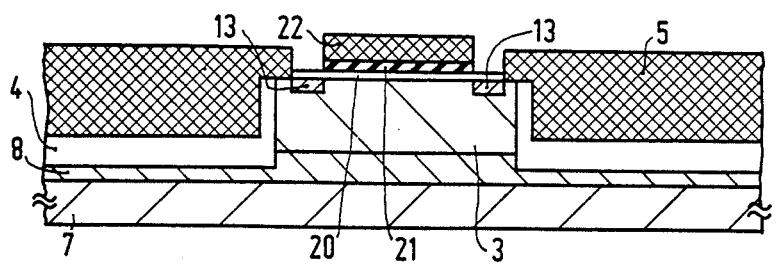
Figure 8:
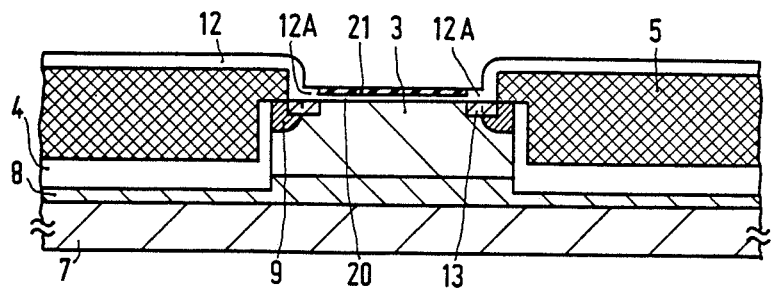
Figure 9:
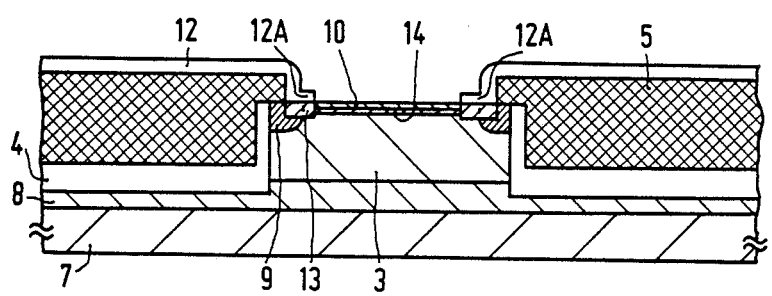

The exposed silicon oxide 26 is then selectively etched away, after which the exposed parts of the first silicon nitride layer 21 are removed. Subsequently, the p-type connection zones 13 are formed in the subjacent parts of the silicon region by implantation of boron ions. The structure then obtained is shown in FIG. 7.

In this embodiment, the connection zones 13 have a doping concentration of $10^{18}$ at/cm$^3$ and a thickness of 0.3 μm. The ion implantation is carried out at an energy of 30 keV and a dose of $3.10^{13}$ boron ions per cm$^2$ through the 30 nm thick oxide layer 20. It is also possible to realize the connection zones in a different manner, for example by diffusion, in which event the oxide layer 20 is preferably removed before the diffusion treatment is carried out.

The first silicon layer 22 is now selectively removed by etching in a KOH solution. Due to the fact that the lightly doped silicon 22 is etched therein at a considerably higher rate than the polycrystalline highly p-doped silicon layer 5, no etching mask is required.

Subsequently, the second silicon layer 5 and the connection zones 13 are thermally oxidized, the oxide layer 12 then being obtained, which is thicker than the layer 20. By diffusion from the highly doped polycrystalline silicon layer 5, the strongly p-type conducting "first" zones 9 are obtained (cf. FIG. 8). It should be noted that, if the layer 20 consists of silicon oxynitride, the exposed parts of this layer must be etched away before the thermal oxidation is carried out.

Subsequently (cf. FIG. 9), the first silicon nitride layer 21 is selectively removed by etching. Within the window thus formed, which is bounded by the edge 12A of the oxide layer 12, the active base zone 14 is formed by implantation of boron ions and then the emitter zone 10 (the "second" zone) is formed by implantation of donor ions, for example phosphorus or arsenic ions. These implantations may be carried out either through the layer 20 or after removal of the layer 20. Other doping methods, for example diffusion, may also be used.

After the surface of the emitter zone 10 has been exposed, the electrode 11 and connections to the layer 5 (via contact windows in the oxide layer 12) can be provided. The collector zone can be contacted by a connection to the buried layer 8 (via a window in the oxide layer 4). Thus, the transistor structure of FIG. 1 is obtained.

The method of manufacturing described above can be varied in many ways.

According to another embodiment of the method, there is started in the same manner as when realizing the structure shown in FIG. 2.

Subsequently, like in the preceding embodiment, a depression is etched in the exposed part of the silicon region. In contrast with the preceding embodiment, however, the exposed silicon oxide 23 is then immediately etched away, whereupon the assembly is provided with a silicon nitride layer 25, which is removed by plasma etching from the horizontal faces and is maintained on the vertical faces (cf. FIG. 10). The thicker first silicon nitride layer 21 is not entirely removed. By thermal oxidation, the oxide layers 4 and 26 are then formed (cf. FIG. 11).

The silicon nitride 25 is now removed entirely and the exposed thicker silicon nitride 21 is removed only in part by isotropic etching in an etching liquid, for example hot phosphoric acid. The silicon thus exposed of the region 3 and the layer 22 is then thermally oxidized, the oxide layer 6 being formed. The same situation as in FIG. 5 is now obtained and the further procedure is effected again in the same manner as described with reference to FIGS. 5 to 9.

According to a third embodiment of the method, after the structure shown in FIG. 2 has been obtained, a depression has been etched into the layer 3 and the oxide 23 has been removed, without a second silicon nitride layer being provided, the exposed silicon is oxidized. Thus, the situation of FIG. 12 is obtained. This structure is analogous to that shown in FIG. 5, with the only difference that the oxide layer 6 now practically has the same thickness as the oxide layer 4 because no anti-oxidation layer was provided on the vertical wall of the mesa. The procedure of this variation of the method is further the same as described with reference to FIGS. 6 to 9.

In the embodiments described thus far of the method according to the invention, always the structure was formed which is shown diagrammatically in cross-section in FIG. 1. A bipolar transistor was then formed, in which event the "first" zone 9 served as base contact zone, while the "second" zone 10 formed the emitter zone of the transistor and the polycrystalline silicon layer 5 formed the base connection.

The method according to the invention, however, may also be used very suitably for the manufacture of other semiconductor devices. For example, with the use of the invention, inter alia a bipolar transistor having an emitter zone of "submicron" dimensions may be realized.

For this purpose, starting from the situation shown in FIG. 7, first the polycrystalline silicon layer 22 is selectively etched away. Subsequently, arsenic is implanted to form in the silicon layer 5 a highly n-doped layer (cf. FIG. 13). Then the exposed part of the intermediate layer 20 is removed by etching. Thereafter the thermal oxidation is carried out. During this thermal oxidation, the layer 5 is provided with an oxide layer 12, but at the same time the boron and the arsenic diffuse from the layer 5 into the region 3. Due to the fact that the boron diffuses more rapidly than the arsenic, both a very small n-type emitter zone 9 and an active p-type base zone 30 are thus formed (cf. FIG. 14). Due to the fact that a high dose of arsenic is used, also the layer 5 is fully converted to highly n-doped silicon, which constitutes the emitter connection.

Finally, the remaining parts of the layers 20 and 21 are etched away, after which by implantation of boron ions a highly doped p-type "second" zone 10, i.e. the base contact zone, is formed, on which again an electrode layer 11 can then be provided (cf. FIG. 15). Thus, a bipolar transistor having a very small emitter zone 9 is obtained.

The invention is not limited to bipolar devices, but may also advantageously be used in the manufacture of MOS transistors. For example, if in FIG. 8 the zones 9 and 13 are formed on the lefthand side separated from the zones 9 and 13 (by means of an additional masking step), these zones (9, 13) may constitute the source and drain zones of an insulated gate field effect transistor. This gate should be provided on or at least at the area of the layers 20 and 21, if desired after these layers 20 and 21 have been replaced by a newly formed gate oxide layer. In certain circumstances, the polycrystalline silicon layer 22 could also be used as gate electrode. Also in this case, like in the preceding embodiments, the "first" zone 9 is connected via the "intermediate zone" 13 to a "second" zone, which is constituted in this case by the channel region of a MOS transistor and is provided with the aforementioned gate electrode.

Further, in all embodiments, the conductivity types may be replaced (all simultaneously) by the opposite types. Moreover, anti-oxidation layers other than silicon oxynitride/silicon nitride combinations may be used.

Finally, it should be noted that, in order to improve the conduction, the silicon layer 5 may be provided by means of the usual techniques with a surface layer consisting of a metal silicide.

We claim:
1. A semiconductor device comprising
   (a) a semiconductor body having a region of monocrystalline silicon adjoining a surface of said body,
   (b) a sunken oxide layer laterally surrounding said region of monocrystalline silicon,
   (c) a highly doped silicon layer disposed on said sunken oxide layer and partially overlapping a top surface of said region of monocrystalline silicon near a lateral edge thereof,
   (d) an oxide layer separating substantially entirely said lateral edge of said region of monocrystalline silicon from said silicon layer,
   (e) a doped first zone of said region of monocrystalline silicon, said doped first zone being of the same conductivity type as said highly doped silicon layer, said doped first zone being disposed at least at said top surface near said lateral edge of said region of monocrystalline silicon, and said highly doped silicon layer adjoining said doped first zone at said top surface of said region of monocrystalline silicon,
   (f) a doped second zone disposed over a remaining surface of said region of monocrystalline silicon, said doped second zone being disposed adjacent to but separated from said doped first zone,
   (g) an electrode disposed on said doped second zone,
   (h) a self-aligned oxide strip separating said highly doped silicon from said electrode, and
   (i) at least one doped connection zone disposed in said top surface of said region of monocrystalline silicon, said at least one doped connection zone being disposed below said self-aligned oxide strip between said doped first zone and said doped second zone to separate said doped second zone from said doped first zone, and said at least one doped connection zone having a width the same as said self-aligned oxide strip.

2. A semiconductor device according to claim 1, wherein said doped first zone is a base contact zone of a bipolar transistor, said doped second zone is an emitter zone of said bipolar transistor, and said highly doped silicon layer is a base connection zone of said bipolar transistor.

3. A semiconductor device according to claim 1, wherein said doped first zone is an emitter zone of a bipolar transistor, said doped second zone is a base contact zone of said bipolar transistor, and said highly doped silicon layer is an emitter connection zone of said bipolar transistor.

* * * * *